United States Patent [19]

Koskenmaki

[11] Patent Number: 5,185,178
[45] Date of Patent: Feb. 9, 1993

[54] METHOD OF FORMING AN ARRAY OF DENSELY PACKED DISCRETE METAL MICROSPHERES

[75] Inventor: David C. Koskenmaki, St. Paul, Minn.

[73] Assignee: Minnesota Mining and Manufacturing Company, St. Paul, Minn.

[21] Appl. No.: 706,793

[22] Filed: May 29, 1991

Related U.S. Application Data

[60] Division of Ser. No. 500,225, Mar. 27, 1990, Pat. No. 5,026,599, which is a continuation of Ser. No. 237,998, Aug. 29, 1988, abandoned.

[51] Int. Cl.$^5$ .............................................. B05D 3/06
[52] U.S. Cl. .................................. 427/585; 427/100; 427/124; 427/250; 427/277; 427/294
[58] Field of Search ................ 427/250, 294, 277, 42, 427/100, 124

[56] References Cited

U.S. PATENT DOCUMENTS

| | | | |
|---|---|---|---|
| 4,486,464 | 12/1984 | Young | 427/63 |
| 4,714,047 | 12/1987 | Ikeda et al. | 118/724 |
| 5,017,550 | 5/1991 | Shioya | 427/42 |

Primary Examiner—Janyce Bell
Attorney, Agent, or Firm—Gary L. Griswold; Walter N. Kirn; Darla P. Neaveill

[57] ABSTRACT

An array of densely packed discrete metal microspheres which may be deformable and electrically conductive may be formed on a substrate by a method including the steps of providing a substrate having a depositing surface in the chamber forming a metal vapor in the chamber and depositing the metal vapor on the depositing surface, the depositing surface having a temperature at or above the melting point of the metal.

7 Claims, 3 Drawing Sheets

METHOD OF FORMING AN ARRAY OF DENSELY PACKED DISCRETE METAL MICROSPHERES

This is a division of Ser. No. 07/500,225, filed Mar. 27, 1990, now U.S. Pat. No. 5,026,599 which is a continuation of Ser. No. 07/237,998, filed Aug. 29, 1988, now abandoned.

TECHNICAL FIELD

The present invention relates to arrays of metal microspheres and particularly to discrete, densely-packed metal microspheres which are deformable and conductive.

BACKGROUND OF THE INVENTION

There are many uses for an array of densely-packed, discrete, metal microspheres supported on a substrate, particularly when the microspheres are deformable and conductive. The general areas in which such an array of metal microspheres can be used include electric circuits, micro-soldering, and imaging.

In the area of electric circuits, a so-called breadboard for the testing of electric circuits can be made by providing an array of discrete, densely-packed conductive, deformable, metal microspheres. An electric circuit can be formed in the array by tracing through the microsphere-coated surface with a sharp object. Electrical contact is made between the individual microspheres where pressure is applied, deforming the spheres and forming a desired electric pathway in the otherwise non-conductive surface. If desired, such a circuit can be preserved by coating the surface with a protective plastic or the like.

In a related application, a security film can be made by coating such an array of conductive, deformable metal microspheres with a protective cover film. Tampering is evidenced by the presence of regions of deformed spheres which may be detected visually or electrically.

Powders used for fine scale micro-soldering, currently produced by spray atomization, can be produced by removing the individual metal microspheres from a substrate. In addition, an entire array of metal microspheres can be used to deliver solder, for example, by placing such an array against a circuit and heating the back side of the substrate. When heated, the individual metal microspheres melt and are transferred as solder to the circuit.

An array of discrete, densely-packed, metal microspheres can be made which is useful in imaging. Such arrays are typically transparent and dull in appearance. When pressure is applied to the transparent, dull array of microspheres the array becomes opaque and shiny in the areas where pressure is applied. The degree of transparency and specular reflectance is dependent on the amount of pressure applied to the individual metal microspheres. Various useful images or patterns can be produced, for instance, by pressing an embossed surface against such an array of microspheres.

These and other important and varied uses for an array of densely-packed, discrete, metal microspheres, particularly microspheres which are deformable and conductive, has heretofore existed in the art. Therefore, a need exists to provide an array of densely-packed, discrete, metal microspheres on a substrate, preferably by a method which is commercially feasible. It is desirable that these metal microspheres be deformable and conductive and be extremely densely packed so that the array is useful for the end uses discussed above.

SUMMARY OF THE INVENTION

The present invention provides a substrate having a discontinuous metal coating, the coating comprising an array of densely-packed, discrete, metal microspheres. The present invention also provides a commercially feasible method of making such an array. The metal microspheres are preferably deformable and individually electrically conductive.

"Deformable" is defined herein as capable of being substantially deformed by the application of a slight pressure, such as that provided by being pressed with a human fingernail.

"Discrete" is defined herein as meaning unconnected distinct parts so that each sphere does not touch a neighboring sphere.

"Densely-packed" is defined to mean crowded closely together, such that when, for example, a sphere is deformed it will necessarily make contact with a neighboring sphere.

The metal microspheres of the present invention are preferably selected from the group of metals consisting of lead, tin, indium, bismuth, cadmium, thallium, zinc, alloys of these metals and mixtures of such metals and alloys. Hereinafter, "metal" will refer to both metals and alloys.

The microspheres of the present invention may have a very wide range of diameters, but for certain end uses preferably have average diameters in the range of about 0.1 micrometers to about 5.0 micrometers, and more preferably 0.1 micrometers to about 2.0 micrometers.

A preferred array of densely-packed, discrete, metal microspheres of the present invention is characterized in that the projected area of uniformly distributed the microspheres comprises at least about 60% of the total surface area of the substrate upon which they are supported.

An array of microspheres of the present invention may be produced by a method comprising the steps of:
(a) providing a substrate in a chamber;
(b) forming a metal vapor in the chamber; and
(c) depositing an array of densely packed discrete metal microspheres on said substrate.

The method preferably includes providing a substantial vacuum in the chamber before forming the vapor. The method also preferably includes depositing the metal vapor on a depositing surface of the substrate which has an effective temperature of greater than the melting temperature, $T_m$ of the metal.

The effective temperature is defined as the actual temperature of the substrate plus any increase in temperature due to the heat of condensation of the metal as it is deposited on the surface of the substrate.

DETAILED DESCRIPTION OF THE PRESENT INVENTION

Figure 1:
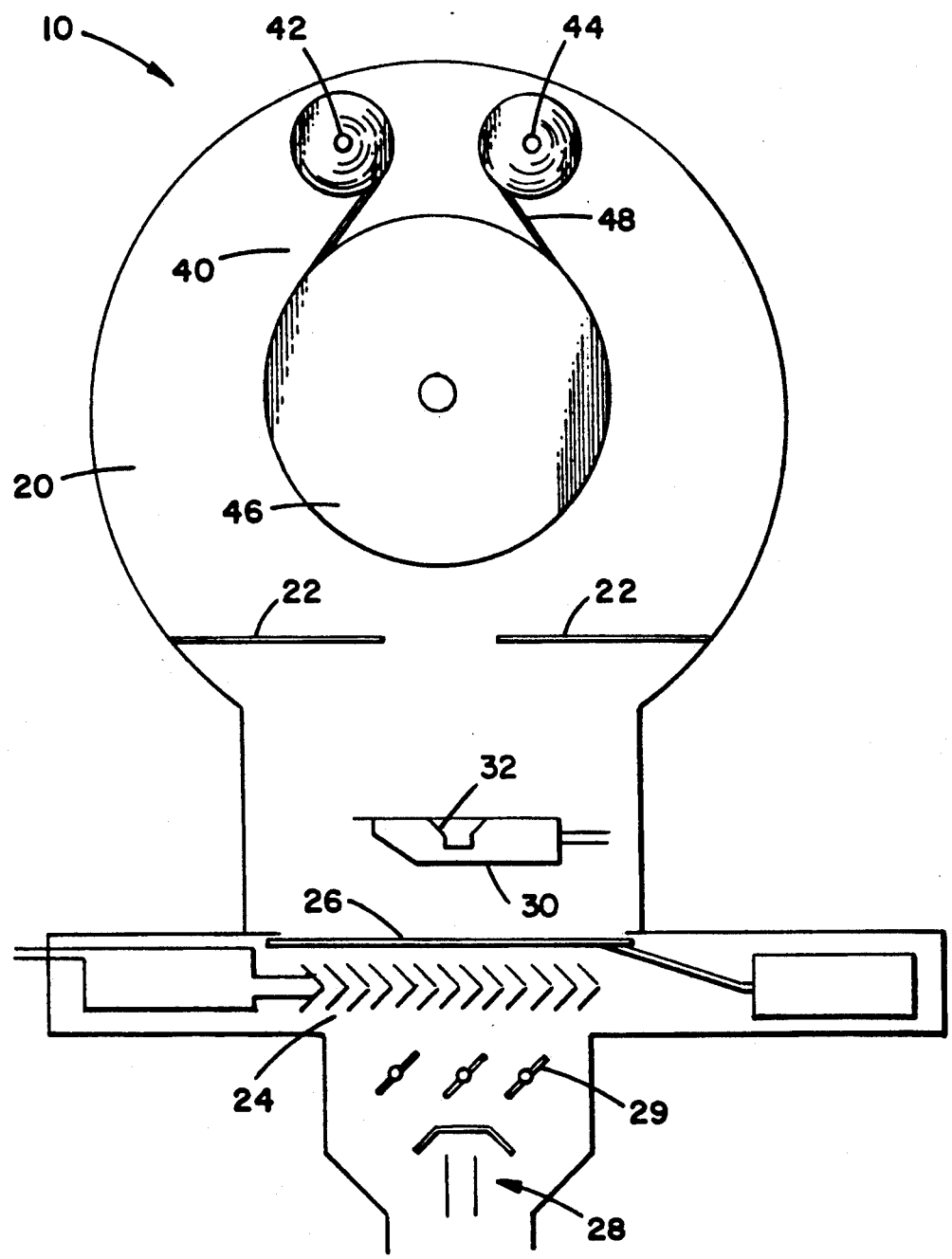
FIG. 1 is a schematic drawing of an apparatus used to practice the method of the present invention.
Figure 2:
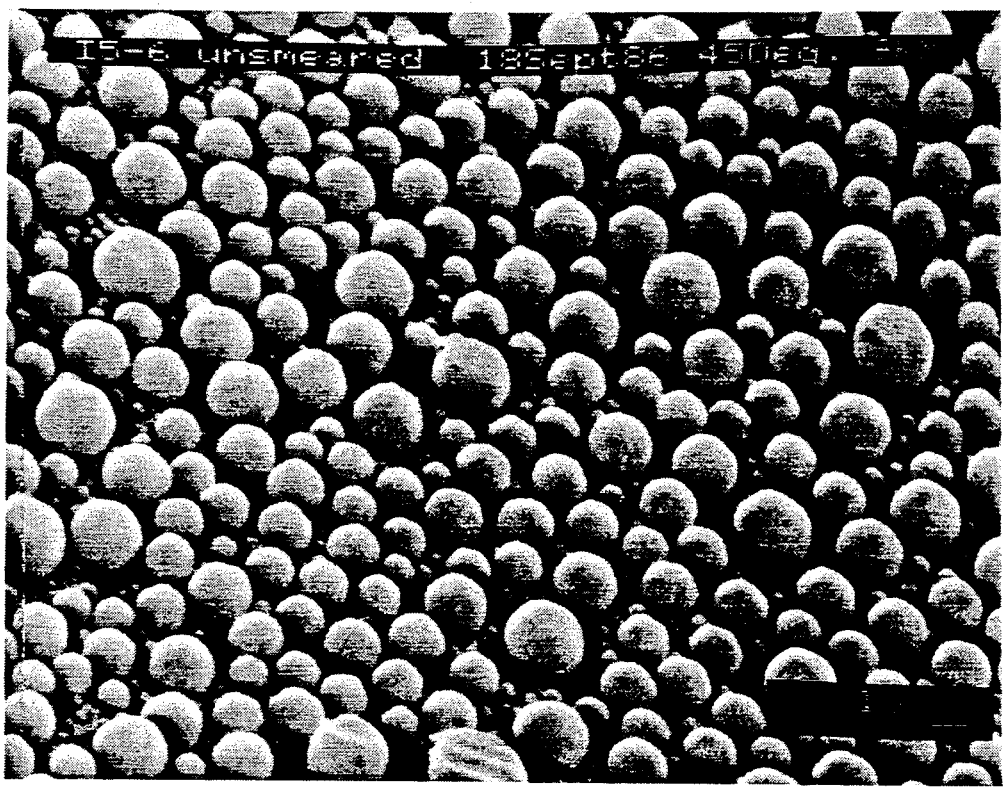
FIG. 2 is a photomicrograph of an array of the invention comprising indium metal deposited on polyimide.
Figure 4:
FIG. 4 is a photomicrograph of an array of the invention comprising indium metal on polyimide after it has been smeared.
Figure 3:
FIG. 3 is a photomicrograph of an array of the invention comprising indium metal deposited on polyimide after it has been partially smeared.
Figure 5:
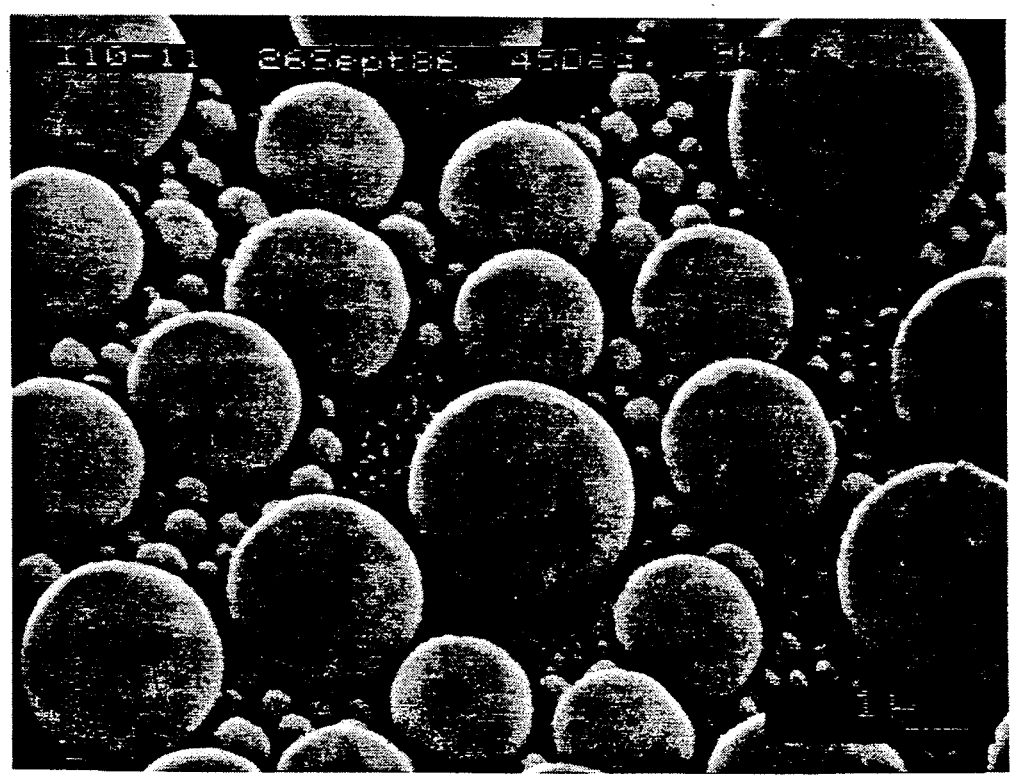
FIG. 5 is a photomicrograph of an array of the invention comprising lead metal deposited on polyimide.

The present invention provides an array of densely-packed, discrete, metal microspheres supported on the surface of a substrate and a method for producing such an array. Previous methods of producing arrays of metal microspheres supported by a substrate have been unable to produce sufficient packing densities. For many end uses, it is important that the metal microspheres be discrete, but yet very closely packed together. In a preferred embodiment of the present invention, the metal microspheres are deformable and electrically conductive. These discrete microspheres are packed sufficiently close together that when slight pressure is applied, for example, the pressure provided by being pressed with a human fingernail, the microspheres are deformed to form physical and electrical contact with a neighboring sphere or spheres. It is the extremely close proximity of the spheres, while remaining discrete, which makes the present invention of particular utility. It is to be understood that the terms "spheres" and "microspheres" will be used throughout to describe each individual discrete metal deposit on the substrate. It is to be understood that these individual deposits may not be actual spheres, but may instead approximate a segment or portion of a sphere.

The arrays of the present invention include two general parts: the substrate and the metal microspheres which are supported by the substrate. In addition, a novel process by which the metal microspheres are deposited onto the substrate is described.

Substrates

A substrate which is suitable for use in the present invention should be selected in accordance with the needs of its end use. The substrate may be flexible or inflexible, transparent or opaque, made from many different materials, have a wide variety of thicknesses and widths, and so on. A substrate should be selected which has a surface which is not wet by the liquid metal which is used to form the metal microsphere. Secondly, a substrate should be selected which is not degraded by the temperatures experienced in processing.

The wettability of a liquid when placed onto a substrate is at least partially dependent on the surface tension between the liquid and the substrate. In general terms, the greater the surface tension, the greater the wetting angle between the droplet of liquid and the substrate. If the surface tension is sufficiently great, the liquid will form discrete droplets and will not coalesce with neighboring droplets to form a liquid film on the substrate. Wetting refers to the tendency of a liquid to form a liquid film on a given surface, as opposed to non-wetting where the liquid forms individual discrete droplets on the surface.

For the purposes of the present invention, it is sufficient that the liquid droplets of the selected metal form discrete, liquid metal droplets on the surface of the substrate when deposited thereon. When this condition is satisfied it will be referred to as a liquid metal which is non-wetting, or which does not wet, with reference to a particular substrate surface.

The substrate chosen for use in the present invention should also be capable of withstanding the temperatures experienced in processing. The surface of the substrate on which the metal is deposited should have an effective temperature at or above the melting point of the metal at the time the vapor is deposited thereon. The substrate should be able to withstand temperatures necessary to provide such a depositing surface temperature.

Examples of polymers which may be used as substrates in the present invention include: polyphenylene oxides; polymers of flourinated olefines such as polytetrafluoroethylene; silicone polymers; cellulosic polymers; polyurethanes; engineering plastics such as polystyrene, styrene/acrylonitrile copolymers, copolymers containing polymerized styrene, acrylonitrile and butadiene (often called ABS polymers), styrene/butadiene copolymers, rubber modified styrene polymers, styrene/maleic anhydride copolymers and similar polymers of monovinylidene aromatic carbocyclic monomers; polycarbonates including those made from phosgene and bisphenol A and/or phenolphthalein; polyesters such as polyethylene terephthalate; acrylic resins such as poly(methyl methacrylate); polyacetyl resins such as polyacrylonitrile and other polymers of alpha,beta-ethylenically unsaturated nitriles such as acrylonitrile/methyl methacrylate copolymers; polyamides such as nylon, polyolefins such as polethylene and polypropylene, polyvinyl halides such as polyvinylchloride and vinyldene chloride homopolymers and copolymers, polysulfones, polyarylsulfones, and perfluorinated-ethylene-propylene copolymer.

In addition, metal substrates such as aluminum (typically wet by molten metals) coated with at least a thin non-wetting coating of aluminum oxide, or other metals with a non-wetting oxide coating may be used. In general substrates which are unsuitable for use because they are wet by the selected liquid metal may be coated with a non-wetting coating to provide a suitable depositing surface.

Metal Microspheres

A number of metals and metal alloys (hereinafter collectively referred to as "metal") are suitable for use in the present invention. The metal must be able to be vaporized and deposited onto the substrate which is chosen for use in the present invention. A metal vapor as used herein refers to suspended metal particles, whether provided through sputtering, evaporation, or the like.

It is preferred that the metal microspheres formed from the metal chosen be deformable and electrically conductive. These characteristics are important in many of the desired end uses for arrays of densely-packed, discrete, metal microspheres of the present invention. It is also preferred that the metal be a low melting metal defined as a metal which has a melting temperature or range of melting temperatures of 400° C. or below. This allows a wider range of polymeric substrates to be used. Preferred metals include lead, tin, indium, bismuth, thallium, cadmium, zinc, alloys of these metals, and mixtures of pure metals and alloys.

For the metal to properly deposit on the substrate in the form of discrete liquid droplets, the metal should have a vapor pressure at its melting temperature, or throughout its range of melting temperatures, which is less than the effective partial pressure of the atmosphere surrounding the metal droplet after it is deposited on the substrate. Deposition is preferably accomplished in a vacuum chamber, thus, the effective partial pressure is defined as the amount of metal vapor at the surface of the substrate. If the vapor pressure is greater than the effective partial pressure, the metal will revaporize into the surrounding atmosphere and not form suitable liquid droplets on the heated substrate.

It is preferred that the metals used in the arrays of the present invention be relatively soft and deformable so that the array may be used in many of the above end uses. A soft metal can be described as a metal which will typically have a Brinell Hardness Number (BHN) of roughly less than 50. BHN values for some metals are:

| | |
|---|---|
| Indium | 0.9 |
| Tin | 3.5 |
| Lead | about 2 |
| Bismuth | 7.0 |
| 70% tin-30% lead | 12.0 |
| Lead alloys | 8-24 |

Process For Forming Metal Microspheres

To produce an array of densely-packed, discrete, metal microspheres of the present invention, the metal or metals and substrate or web are selected. A metal which has a melting temperature, $T_m$, is selected. In the case of alloys having a range of temperatures in which they melt, $T_m$ is defined as the top end of the melting temperature range. Because melting point is pressure dependent, and thus may vary slightly between a vacuum and standard atmosphere pressure, $T_m$ will be precisely defined in terms of the melting point of the metal at the pressure at the time of deposition.

A substrate which is not wet by the metal when the metal is at a temperature of $T_m$ or above (i.e. in the liquid state) is also selected. The substrate is then prepared and the array of metal microspheres is deposited thereon.

A preferred method for depositing a suitable array of microspheres is as follows: First, the substrate is provided in a substantial vacuum chamber. A suitable vacuum is typically about $10^{-4}$ to $10^{-5}$ torr. The effective temperature of the depositing surface of the substrate is at $T_m$ or above when the metal is deposited thereon. The effective temperature of the substrate is defined herein to mean the actual temperature of the depositing surface of the substrate, plus any increase in temperature due to heat of condensation of the metal as it is deposited onto the surface. Heat provided by the source used to vaporize the metal can also raise the temperature of the substrate and must be considered. Next, a metal vapor is formed in the vacuum chamber and allowed to deposit on the depositing surface of the substrate which is at a temperature of $T_m$ or above. The metal vapor is deposited on the heated surface in a liquid form and the droplets of liquid metal bead up on the surface. The liquid droplets of metal are then allowed to cool, forming the array of densely-packed, discrete, metal microspheres on the substrate.

The metal vapor is preferably produced in the chamber by means of evaporation of a metal. Depositions on the surface is therefore in the form of condensation from a vapor to a liquid. In addition to evaporation, sputtering can also be used to form a suitable metal vapor. Forms of evaporating a metal include electron-beam (E-Beam) evaporation and evaporation through the use of resistance heating. E-beam evaporation such as the embodiment depicted in FIG. 1, is preferred.

Referring to the embodiment of the invention shown in FIG. 1, a microsphere coating apparatus, generally designated 10, is shown. The apparatus 10 includes a vacuum chamber 20, an electron beam source 30 and a web conveyor generally designated 40.

The web conveyor 40 includes a supply roll 42, a wind-up roll 44, a drum 46 and a web 48. The web 48 is provided from the supply roll 42 and is moved around the drum 46, which is heated to a desired temperature, and is then wrapped around the wind-up roll 44.

The electron-beam source 30 includes a sample pot 32 in which the metal is placed to be vaporized. The electron beam source 30 provides a beam of electrons directed at the pot 32 sufficient to vaporize the metal.

The vacuum chamber 20 includes a pair of shields 22, a liquid nitrogen trap 24, a valve means 26, a diffusion pump 28 and variable orifices 29.

In use, a vacuum is drawn in the chamber 20, by means of the diffusion pump 28. A charge of metal is placed in the pot 32 and it is vaporized by means of the electron beam source 30. The vapor rises through the chamber 20, guided by the shields 22 and is deposited on the web 48 as it is moving by on the surface of the drum 46.

The substrate is preferably provided in the vacuum chamber in the form of a heated, moving web as shown in the embodiment of FIG. 1. The web is heated to a sufficient temperature so that at the point the metal vapor is condensed the depositing surface of the substrate has an effective temperature of $T_m$ or greater. The web may be heated by means of a heated drum such as the drum 46 in FIG. 1.

After the liquid metal droplets are condensed onto the surface of the web or substrate, the droplets are allowed to cool. Cooling may be promoted by means of a cooling roller on the back side of the web (not shown). The back side is the side of the web opposite of the depositing surface. The coated substrate may then be formed into a roll for future use such as shown in FIG. 1.

The size and the size distribution of the metal microspheres can be determined and controlled. It is believed that a metal vapor initially comes into contact with the substrate, minute liquid droplets are formed. As additional metal vapor comes into contact with the substrate the size of the droplets increases. As the size and number of the droplets increases droplets coming into contact with other droplets coalesce to form larger droplets. Growth is primarily a function of rate of deposition of vapor. The operator may adjust the processing parameters to control droplet size.

The size of the microspheres can be determined and controlled by two means; the amount of metal vapor produced by the source, i.e. the E-beam evaporation apparatus or the like, and the speed by which the substrate web is moved through the metal vapor in the vacuum chamber. Thus, the higher the rate of speed of the substrate web, the lower the amount of vapor that will be deposited. Likewise, the larger the quantity of metal being evaporated per unit time, the larger the amount of vapor being deposited. Keeping the web speed high and the metal evaporation rate low will cause small microspheres to be formed. As the speed of the web decreases and/or the amount of metal being evaporated increases, the size of the microsphere increases. It is also believed that the size distribution range of the microspheres will also increase as the speed decreases and amount of metal vapor is increased, as the metal droplets get larger. Arrays having a large number of relatively larger droplets interspersed with very small droplets will be produced.

The diameter of the microspheres of the present invention is measured at the point of contact between the sphere and the substrate. Diameters of the microspheres of the present invention typically range from several angstroms to 10 micrometers and greater; typical average diameters of particularly useful ranges are about 0.1 micrometer to about 5.0 micrometers, and preferably about 0.1 micrometer to about 2.0 micrometers.

A preferred array of microspheres of the present invention is characterized in that the microspheres comprise at least 60% of the total surface area of the substrate, as measured by the projected area on the substrate viewed perpendicular to the substrate. Arrays having extremely close packing densities can be made, but are not conductive in the horizontal plane because it is comprised of discrete metal microspheres.

The invention is further described by the following non-limiting examples:

EXAMPLE 1

An array of microspheres of the present invention was made using an apparatus of the type depicted in FIG. 1. The drum 46 was a 40 cm diameter resistance heated drum. The electron beam source used an Airco Temescal CV-14 power supply.

A charge of 300 grams of indium metal was placed in a zirconia lined pot of the electron beam evaporation source. The source was located 25 cm. from the drum. The shields formed a 10 cm.×20 cm. window located 2.5 cm. from the drum and positioned symetrically above the evaporation pot. The long dimension of the window was positioned parallel to the axis of the drum.

A 30 meter long roll of polyimide film (Kapton V film, commercially available from Dupont) 15 cm wide and $7.5 \times 10^{-2}$ millimeter thick was provided on a vacuum chamber of the type shown in FIG. 1. The film was fed around the drum to the take-up roll. A vacuum was drawn in the chamber and the pressure was reduced to $2 \times 10^{-5}$ torr. The drum was heated to 200° C. An electron beam voltage was 10 kV and a current of 0.13 ampere is directed at the pot. The drum was rotated to give a web speed of 150 cm/minute.

A coating of indium microspheres having an average diameter of 1 micrometer was formed on the polyimide substrate. The coating had a dull appearance and light would pass through the array. The electrical resistance of the array was in excess of 30 megohms/square, the limit of the testing equipment. When rubbed lightly the appearance of the microsphere coating became shiny and opaque and had an electrical resistance of 0.5 ohm/square.

EXAMPLES 2-6

A series of arrays of the present invention were made following a procedure similar to that described in Example 1 except that 280 grams of tin were loaded into the pot and the drum was heated to 259° C. The electron beam was set to 10 kV and 0.15 amperes and the drum was rotated at varying speeds. Arrays of tin microspheres were formed on the polyimide substrate as described in Table I.

TABLE I

| Example | Average sphere diameter in micrometers | Web speed in cm/minute |
| --- | --- | --- |
| 2 | 0.1 | 240 |

TABLE I-continued

| Example | Average sphere diameter in micrometers | Web speed in cm/minute |
| --- | --- | --- |
| 3 | 0.2 | 120 |
| 4 | 0.4 | 60 |
| 5 | 0.8 | 30 |
| 6 | 1.3 | 21 |

EXAMPLE 7

An array of the microspheres of the present invention was made following a procedure similar to that outlined in Example 1, except that 300 grams of lead was loaded into the pot and the drum was set to 305° C. The drum was set to rotate at a constant speed giving a constant web speed of 120 cm/min. The electron beam voltage was set to 10 kV and the current was slowly varied from 0.12 ampere to zero. At 0.08 ampere, lead spheres having a diameter of 2 to 3 micrometers were formed on the polyimide substrate. At 0.04 ampere, 0.2 micrometer diameter lead spheres were formed. Even though the drum temperature was not above the melting point of lead (327° C.), radiant heat from the pot was sufficient to increase the substrate temperature and allow the condensation of molten lead spheres.

EXAMPLE 8

An array of microspheres of the present invention was made following a procedure similar to that outlined in Example 1 except that 150 grams of tin and 50 grams of lead were loaded into the pot. The drum was set to 178° C. The electron beam was set to 10 kV and 0.10 ampere. The web speed was set to 240 cm/min. Because lead has a higher vapor pressure than tin, the first microspheres formed were mostly lead. After 3 minutes, the microspheres were mostly tin. After 5 minutes microspheres of 70 wt % tin, 30 wt % lead and having a rough diameter of 1 to 1.3 micrometers were formed on the polyimide substrate. Again, radiant heat from the pot provided extra energy to heat the substrate to above the melting point of the lead-tin alloy.

EXAMPLE 9

An array of microspheres of the present invention were prepared following the procedures set forth in Example 1 except that aluminum was evaporated with the drum at room temperature and the electron beam was set to 10 kV and 0.29 ampere. The web speed was 120 cm/min. The aluminum formed a thin uniform film on the polyimide. After coating the polyimide with aluminum, the pot was reloaded with 300 grams of indium. The drum was heated to around 150° C. and indium was evaporated onto the aluminum coated polyimide. The electron beam was held at 10 kV and 0.16 ampere throughout this coating step and the web speed was varied from 120 cm/min to 600 cm/min. At 600 cm/min indium microspheres of around 0.2 micrometers in diameter were formed on the aluminum coated polyimide. They appeared dark blue in ordinary light due to interference effects of the light reflecting from the spheres and the aluminum under-coating.

What is claimed is:

1. A method for forming on a substrate a discontinuous metal coating comprising an array of densely-packed, discrete metal microspheres, said method comprising the steps of:

(a) providing a substrate having a depositing surface in a chamber;
(b) providing a vacuum of at least about $1 \times 10^{-4}$ torr in said chamber,
(c) forming a metal vapor in said chamber,
(d) depositing said metal vapor in liquid droplets on said depositing surface, said depositing surface having an effective temperature of at least the melting point of said metal at the of at least the melting point of said metal at the time when said metal is deposited thereon causing the metal vapor to condense on said depositing surface in the form of said liquid droplets, wherein an array of densely-packed discrete metal microspheres is formed on said depositing surface.

2. The method of claim 1 wherein said metal is selected from the group consisting of Pb, Sn, In, Bi, Zn, Cd, Tl, alloys thereof and mixtures thereof.

3. The method of claim 1 wherein said microspheres have diameters in the range of from about 0.1 to about 5 micrometers.

4. The method of claim 3 wherein said microspheres have diameters in the range of from about 0.1 to about 2 micrometers.

5. A method of claim 1 wherein said metal vapor is deposited on said depositing surface by means of condensation.

6. A method of claim 1 wherein said vapor is produced by evaporating said metal by means of electron beam radiation.

7. A method of forming an electrically conductive pathway comprising applying pressure to a substrate having a discontinuous metal coating comprising an array of densely-packed, discrete metal microspheres, said microspheres having been deposited by the method of claim 1, said pressure sufficient to deform some of said array of microspheres to form an electric pathway therebetween.

* * * * *

UNITED STATES PATENT AND TRADEMARK OFFICE
CERTIFICATE OF CORRECTION

PATENT NO. : 5,185,178
DATED : February 9, 1993
INVENTOR(S) : David C. Koskenmaki It is certified that error appears in the above-indentified patent and that said Letters Patent is hereby corrected as shown below:

Column 9, Line 11, delete "of at least the melting point of said metal at the"
corrected Claim 1(d) should read -- (d) depositing said metal vapor in liquid droplets on said depositing surface, said depositing surface having an effective temperature of at least the melting point of said metal at the time when said metal is deposited thereon causing the metal vapor to condense on said depositing surface in the form of said liquid droplets, --

Signed and Sealed this

Tenth Day of May, 1994

Attest:

BRUCE LEHMAN

Attesting Officer     Commissioner of Patents and Trademarks